United States Patent [19]

Matsuoka

[11] Patent Number: 4,878,860
[45] Date of Patent: Nov. 7, 1989

[54] CONNECTION ARRANGEMENT BETWEEN CONTROL DEVICE AND SIGNAL TRANSMISSION DEVICE

[75] Inventor: Kazushige Matsuoka, Osaka, Japan

[73] Assignee: Omron Tateisi Electronics Co., Kyoto, Japan

[21] Appl. No.: 153,295

[22] Filed: Feb. 5, 1988

[30] Foreign Application Priority Data

Feb. 6, 1987 [JP] Japan .................................. 62-26955

[51] Int. Cl.[4] ............................................. H01R 9/26
[52] U.S. Cl. .................................... 439/716; 439/502
[58] Field of Search ............... 439/350, 928, 715, 716, 439/502, 505

[56] References Cited

U.S. PATENT DOCUMENTS

| 4,477,862 | 10/1984 | Gonzales | 439/928 X |
| 4,558,914 | 12/1985 | Prager et al. | 439/928 |
| 4,581,495 | 4/1986 | Geri et al. | 439/928 X |
| 4,658,375 | 4/1987 | Onogi et al. | 439/928 X |
| 4,709,975 | 12/1987 | Williams, II | 439/350 |
| 4,738,632 | 4/1988 | Schmidt et al. | 439/928 X |

Primary Examiner—Eugene F. Desmond
Attorney, Agent, or Firm—Wegner & Bretschneider

[57] ABSTRACT

In a connection arrangement between a multi connecting terminal type transmission unit and a control unit, a transmission side connector portion and an apparatus side connector portion in each of which a plurality of terminals as many as the number of information signals to be transmitted are collectively formed are respectively provided for the multi connecting terminal type transmission unit and the control unit. Both of these connector portions are attachably and detachably connected to each other. With this connection arrangement, by connecting the connector portions on the transmission and apparatus sides, the multi connecting terminal type transmission unit and the control unit are connected.

28 Claims, 6 Drawing Sheets

CONNECTION ARRANGEMENT BETWEEN CONTROL DEVICE AND SIGNAL TRANSMISSION DEVICE

BACKGROUND OF THE INVENTION

1. Field of the Invention

The present invention relates to a connection arrangement between a control device and a signal transmission device to mutually transmit and receive a number of information signals.

2. Prior Art Statement

A connection arrangement between a control unit and a multi connecting terminal type transmission unit is constituted as shown in a perspective view of FIG. 6.

In FIG. 6, reference numeral 101 denotes a multi connecting terminal type transmission unit and 102 is a control unit. Screw terminal portions 103 which are used as connecting portions to be connected with other transmission units are provided in both end portions of one side of the transmission unit 101. A screw terminal portion 104 which is used as a connecting portion to be connected with the control unit 102 is provided over a whole width for the other side of the unit 101. The screw terminal portion 104 consists of a number of screw terminals 104a as many as the number of information signals which are transmitted and received with the control unit 102. The control unit 102 comprises a relay socket 105 in the lower portion and a plurality of relays 106 attached to the upper portion of the relay socket 105. A screw terminal portion 108 consisting of a plurality of screw terminals 108a is provided on one side of the relay socket 105. The screw terminals 104a are connected to the screw terminals 108a through lead wires 107, respectively. Another screw terminal portion 109a is provided on the other side of the relay socket 105. The screw terminal portion 109 consists of a plurality of screw terminals 109a as many as the number of screw terminals 108a and is connected to apparatuses to be controlled by the control unit 102.

However, the conventional connection arrangement with such a constitution has the following drawbacks. Namely, when connecting by the lead wires 107, the screws of the screw terminals 104a and 108a of the transmission unit 101 and control unit 102 must be loosed and both end portions of a number of lead wires 107 must be connected to these screw terminals and thereafter, the screws must be tightened, so the work is laborious and, consequently, the labor cost is high.

On the other hand, since both of the transmission unit 101 and control unit 102 have a number of screw terminals 104a and 108a, there is a drawback such that their sizes are large.

SUMMARY OF THE INVENTION

It is an object of the present invention to enable a signal transmission device and a control device to be easily connected with a simple work.

A connection arrangement according to this invention comprises a control device which can be connected by a plurality of electrical connecting elements as many as the number of a plurality of information signals to be transmitted; a signal transmission device to transmit and receive signals with the control device; and connecting means for connecting the control device with the signal transmission device, wherein the connecting means includes a first connector provided for at least either the control device or the signal transmission device and a second connector which can be attachably and detachably connected with the first connector.

The connecting means can have the following various kinds of forms:

(1) The first connector is provided for both of the control device and signal transmission device. The second connector is provided for both end portions of a bundle of a plurality of signal lines.

(2) The first connector is provided for one of the control device and the signal transmission device. The second connector is provided for one end portion of a bundle of a plurality of signal lines. The other end portion of the signal line bundle is fixedly connected to the other of the control device and the signal transmission device.

(3) The first connector is provided for one of the control device and the signal transmission device. The second connector is provided for the other of the control device and the signal transmission device.

According to the present invention, by connecting the first and second connectors, the signal transmission device and the control device are connected. Therefore, the connection between the signal transmission device and the control device can be fairly easily realized without performing complicated wiring works.

On the other hand, in place of the screw terminal portions of the signal transmission device and control device, the connectors which can be constituted as small-sized forms are provided. Therefore, both of the signal transmission device and control device can be miniaturized as compared with the conventional ones.

The other objects, advantages and features of the present invention will be more fully understood when considered in conjunction with the accompanying drawings.

DETAILED DESCRIPTION OF THE INVENTION

Figure 1:
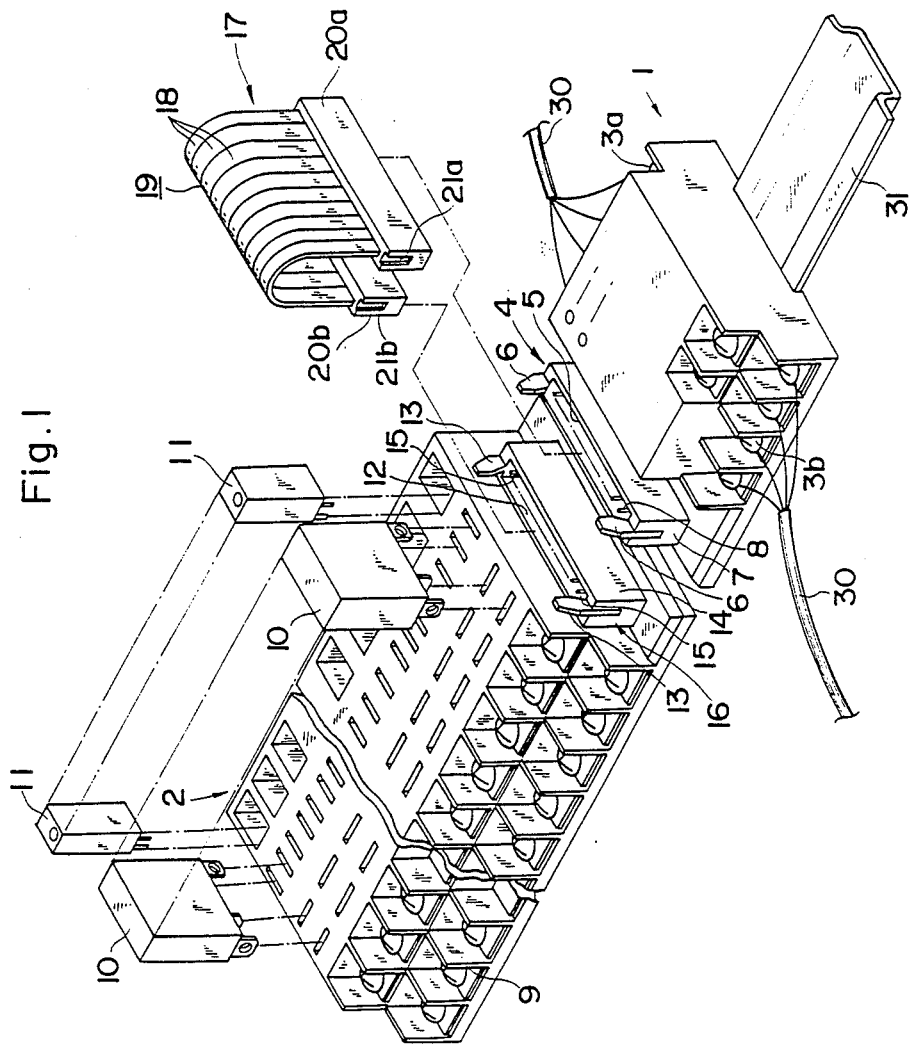
FIG. 1 is a perspective view showing the first embodiment of the present invention.

An embodiment of the present invention will be described in detail hereinbelow with reference to the drawings. FIG. 1 is a perspective view showing a connection arrangement between a multi connecting terminal type transmission unit and a control unit according to the embodiment of the invention.

In this diagram, reference numeral 1 denotes a multi connecting terminal type transmission unit fixed to an attaching plate 31 and 2 indicates a control unit. The casings (housings) of the transmission unit 1 and control unit 2 are molded articles made of a synthetic resin. Screw terminal portions 3a and 3b each consisting of a plurality of screw terminals are provided for two opposite side portions of the transmission unit 1. The screw terminal portions 3a and 3b are used for connection with a serial transmission line 30. A transmission side connector portion 4 (first connector) is integrally vertically provided on another side. The screw terminal portions 3a and 3b serve as connecting portions to be connected with other transmission units through the transmission lines 30. The transmission side connector portion 4 serves as a connecting portion to be connected with the control unit 2. The connector portion 4 comprises a housing 7 and a number of terminals 8 arranged in the housing 7. The housing 7 has an elongated opening 5 in the top surface and retaining members 6 which are projected upward from both end portions.

A screw terminal portion 9 consisting of a number of screw terminals is provided on one side in the longitudinal direction of the control unit 2. The screw terminal portion 9 serves as a connecting portion to be connected with the apparatuses to be controlled. A relay 10 and a circuit module 11 for input/output are detachably attached to the upper surface of the control unit 2. An apparatus side connector portion 16 (first connector) is provided on one side portion of the control unit 2 at the position adjacent to the screw terminal portion 9 in a manner similar to the constitution of the transmission side connector portion 4 in the multi connecting terminal type transmission unit 1 mentioned above. Namely, the connector portion 16 has a housing 14 having an elongated opening 12 in the upper surface and retaining members 13 which are projected upward from both end portions of the housing. The connector portion 16 also has a plurality of terminals 15 as many as the number of terminals 8. The terminal 15 are arranged in the housing 14.

The connecting unit 17 comprises a flat cable 19 and connector portions 20a and 20b made of a synthetic resin. The flat cable 19 is integrally constituted by arranging a plurality of cables 18 as many as the terminals 8 or 15 so as to be parallel with one another. Lead wires are provided in the sheath portions of the cables 18, respectively. The connector portions 20a and 20b (second connectors) are attached to both end portions of the flat cable 19. Retaining concave portions 21a and 21b are formed on both sides of the connector portions 20a and 20b in correspondence to the retaining members 6 and 13 of the connector portions 4 and 16 on the transmission unit and control unit sides, respectively.

The connector portions 20a and 20b of the connecting unit 17 are inserted into the elongated openings 5 and 12 of the connector portions 4 and 16 of the transmission unit 1 and control unit 2, respectively. Thus, the terminals 8 and 15 of the transmission unit 1 and control unit 2 are connected through the lead wires of the connecting unit 17, respectively. Since the retaining members 6 and 13 are retained in the retaining concave portions 21a and 21b, the connector portions 20a and 20b are stably held to the connector portions 4 and 16, respectively.

Figure 2:
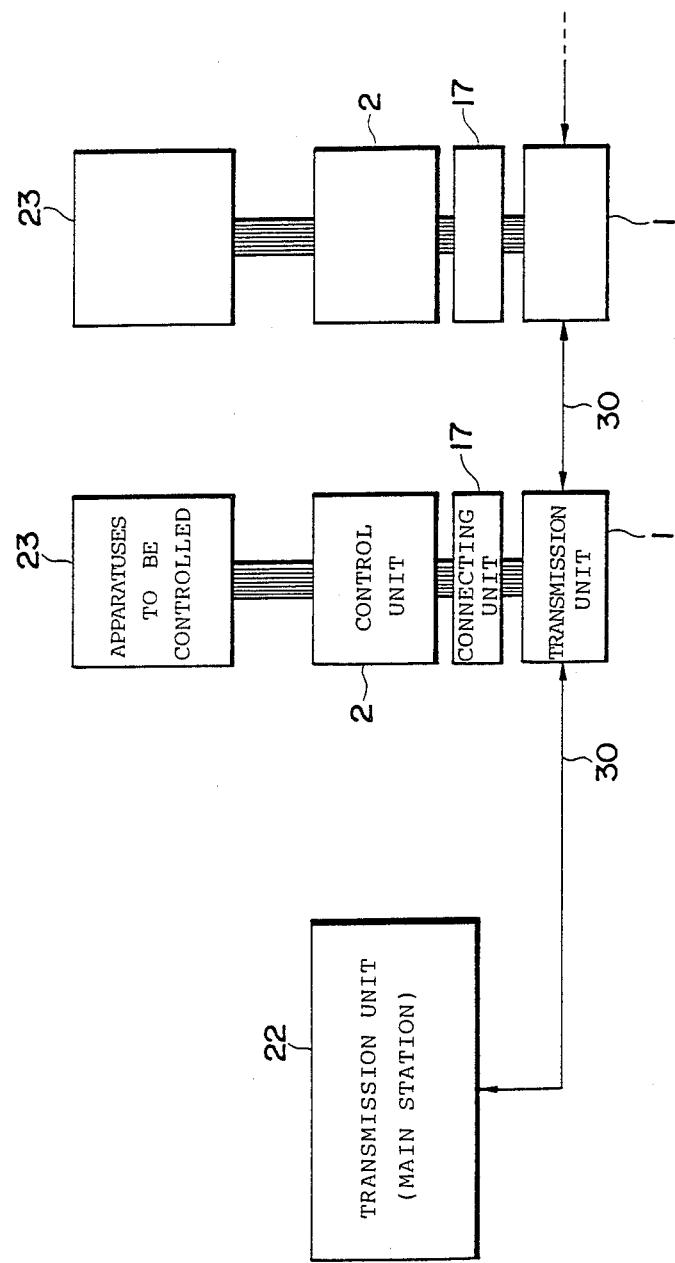
FIG. 2 is a block diagram showing a signal transmission system to which the invention is applied.

FIG. 2 is a block diagram of a transmission system using the connection arrangement of the multi connecting terminal type transmission unit 1 and control unit 2 of the invention. Reference numeral 22 denotes a transmission unit as a main station and 23 indicates apparatuses to be controlled by the control unit 2. The transmission unit 1 and control unit 2 are connected by the connecting unit 17. A control signal is sent from the transmission unit 22 to the control unit 2 through the transmission unit 1. The apparatuses 23 to be controlled are made operative in response to the control signals and operation signals, detection signals and the like are contrarily sent from the apparatuses 23 to be controlled to the transmission unit 22 through the control unit 2 and the multi connecting terminal type transmission unit 1.

The transmission units 22 and 1 are mutually connected by the serial transmission line 30. The transmission unit 1 converts an input signal transmitted via the transmission line 30 into parallel signals and also decodes into a format of a control signal to be given to the corresponding relay 10 or module 11 in the control unit 2. On the other hand, the transmission unit 1 also has a function to directly transmit the input serial signal to the transmission unit 1 at the next stage or to amplify the input serial signal and thereafter transmit to the transmission unit 1 at the next stage. Further, the transmission unit 1 encodes the operation signal, detection signal and the like from the control unit 2 and converts into the serial signal and sends to the transmission unit 22. The transmission unit 1 has a CPU, a memory, an input/output interface and the like to execute the foregoing operations.

Figure 3:
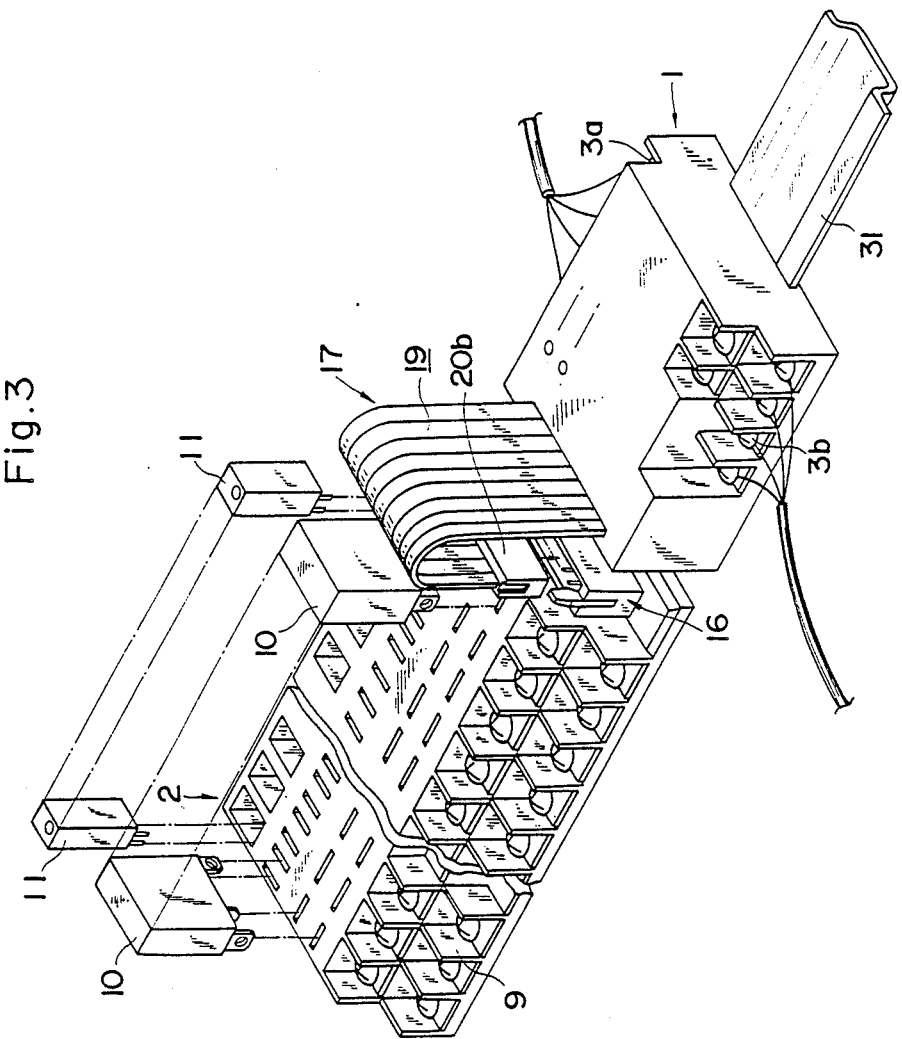
FIG. 3 is a perspective view showing the second embodiment of the present invention.

FIG. 3 shows another embodiment. When comparing with the constitution of FIG. 1, the connector portions 4 and 20a of the connecting unit 17 on the side of the transmission unit 1 are omitted. The lead wire of each cable 18 of the flat cable 19 is fixedly connected to the circuit board in the transmission unit 1 by soldering. Therefore, according to this embodiment, on the side of the control unit 2, by connecting the connector portions 16 and 20b, the control unit 2 can be completely connected with the transmission unit 1.

Figure 4:
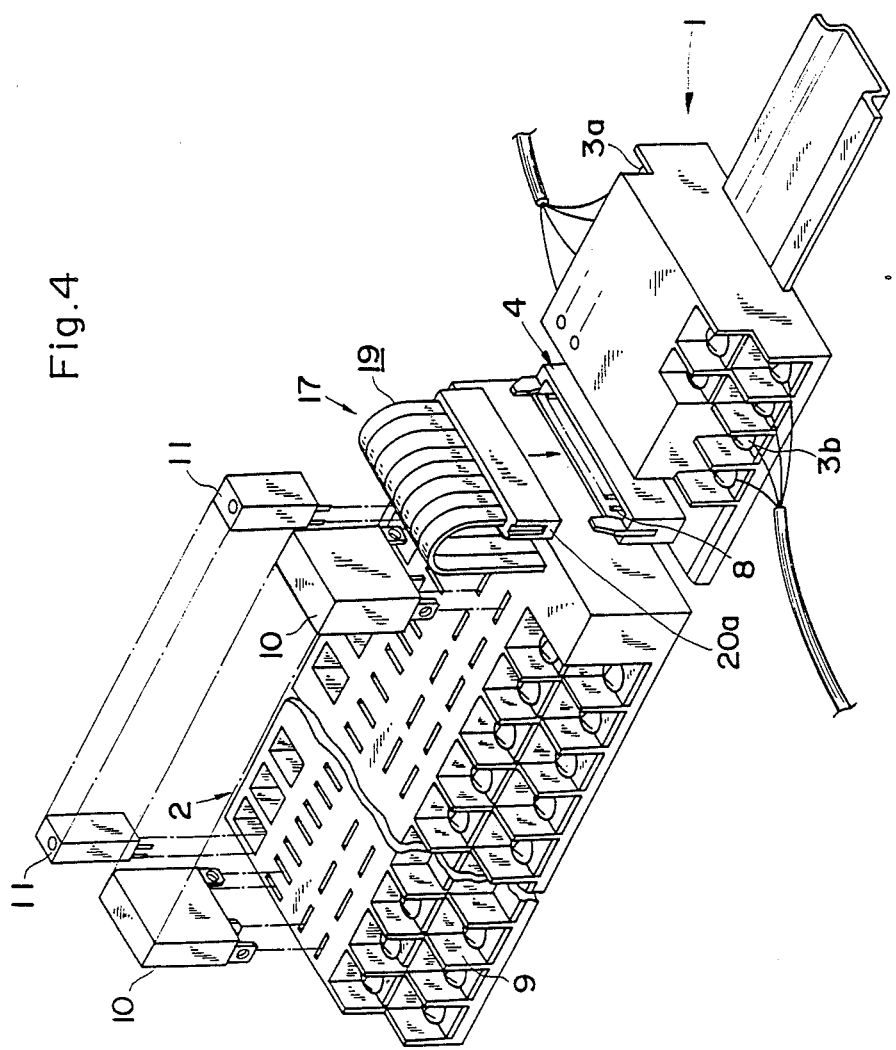
FIG. 4 is a perspective view showing the third embodiment of the present invention.

FIG. 4 shows further another embodiment, in which the connector portions 16 and 20b on the side of the control unit 2 are omitted. The end portions of the cables provided with the connector portion 20b are connected to the circuit board of the control unit 2 by soldering. It is sufficient to connect the connector portion 20a with the connector portion 4 on the side of the transmission unit 1.

Figure 5:
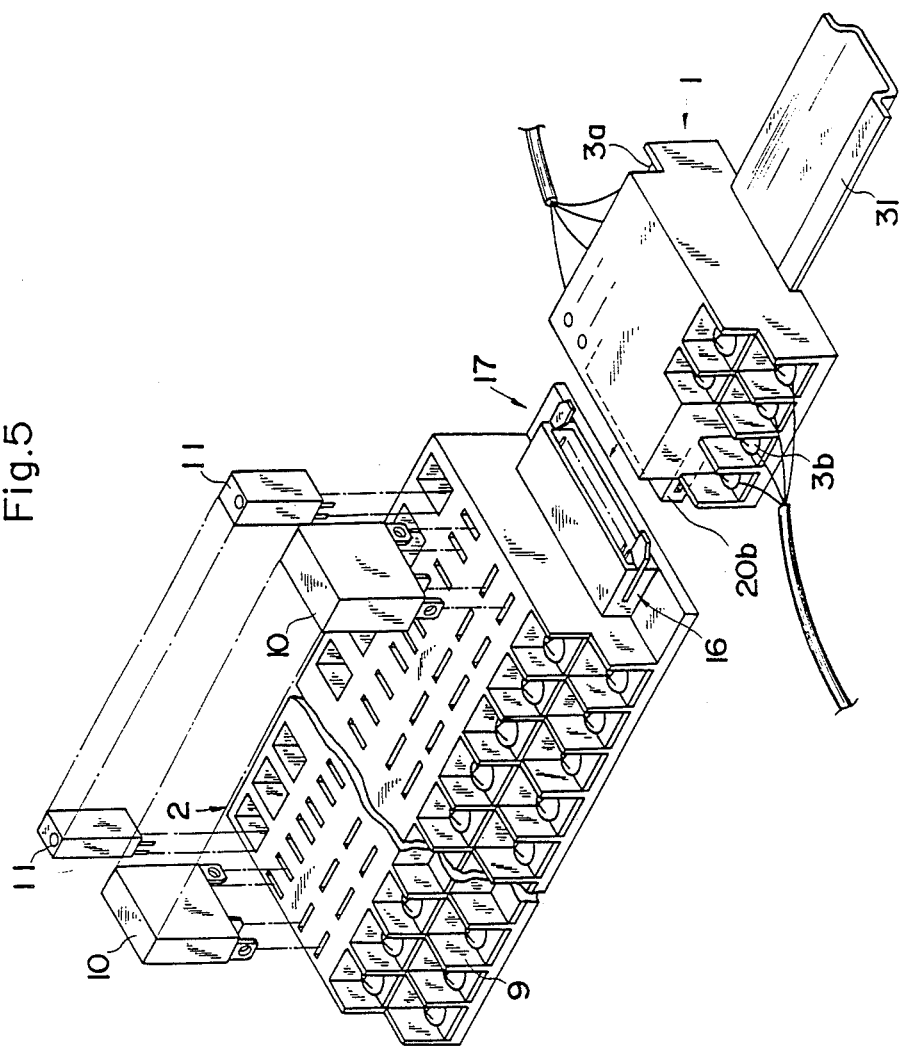
FIG. 5 is a perspective view showing the fourth embodiment of the present invention.
Figure 6:
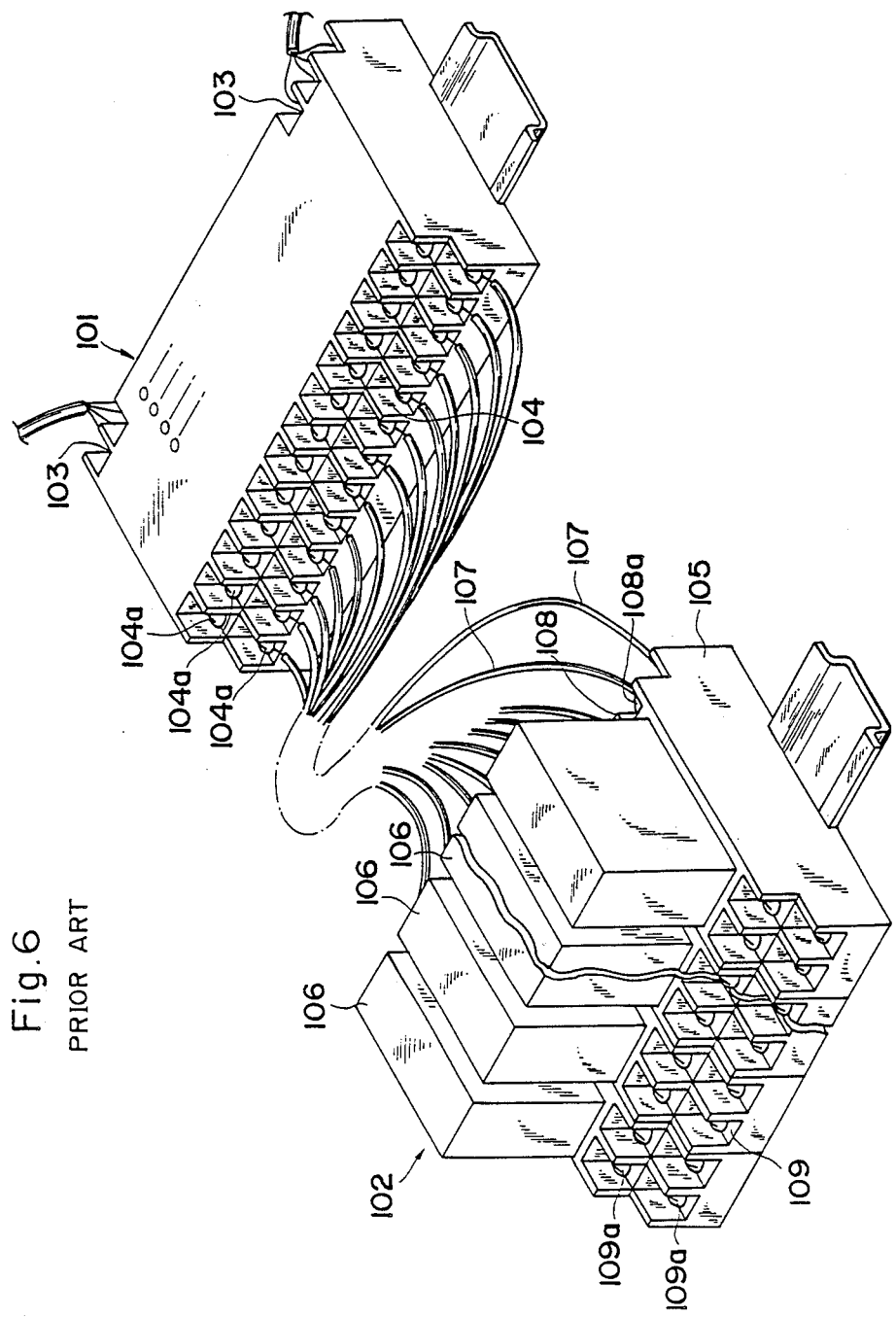
FIG. 6 is a perspective view showing a conventional example.

According to still another embodiment shown in FIG. 5, the connector portion 20b is provided for the transmission unit 1 so as to be projected in the side direction. The apparatus side connector portion 16 of the control unit 2 is provided so that the connecting surface faces the side direction in correspondence to the connector portion 20b. When the control unit 2 is disposed adjacently to the transmission unit 1, the connector portion 20b is inserted into the connector portion 16 and connected.

It is also possible to constitute in a manner such that the connector portion 20b is provided on the upper surface of the unit 1 and the connector portion 16 is provided on the lower surface of the control unit 2. On the other hand, the connector portion 20b may be also provided on the lower surface of the unit 1 and the connector portion 16 may be also provided on the upper surface of the control unit 2.

Further, the connector portion 4 may be also provided for the transmission unit 1 and the connector portion 20a may be also provided for the control unit 2.

The above description and the accompanying drawings are merely illustrative of the application of the principles of the present invention and are not limiting. Numerous other arrangements which embody the principles of the invention and which fall within its spirits and scope may be readily devised by those skilled in the art. Accordingly, the invention is not limited by the foregoing description, but is only limited by the scope of the appended claims.

What is claimed is:

1. A connection arrangement comprising:
   a control device adapted for being connected by a plurality of electrical connecting elements as many as the number of a plurality of information signals to be transmitted;
   a signal transmission device for transmit and receive signals with the control device,
   wherein said signal transmission device is connected between a main station and said control device,
   wherein said signal transmission device has a first converting means for converting an input signal from said main station into a control signal readable by said control device, and
   wherein said signal transmission device has a second converting means for converting a signal from said control device into a transmission signal readable by said main station; and
   connecting means for connecting the control device and the signal transmission device,
   wherein said connecting means includes a first connector provided for at least either one of the control device and the signal transmission device and a second connector which can be attachably and detachably connected with the first connector, and
   wherein said connecting means is used to connect said control device and said signal transmission device and is used for transmitting a number of information signals.

2. A connection arrangement according to claim 1, wherein said signal transmission device is a repeating apparatus of signals.

3. A connection arrangement according to claim 1, wherein said electrical connecting elements are terminals of connectors.

4. A connection arrangement according to claim 1, wherein said connecting means comprises: the first connectors provided for both of the control device and the signal transmission device; a plurality of signal lines; and the second connectors provided for both ends of said signal lines.

5. A connection arrangement according to claim 1, wherein said connecting means comprises: the first connector provided for either one of the control device and the signal transmission device; a plurality of signal lines; and the second connector provided for one end of each of the signal lines, and the other ends of the signal lines are fixedly connected to a board in the other one of the control device and signal transmission device.

6. A connection arrangement according to claim 1, wherein the first connector is provided for one of the control device and the signal transmission device, and the second connector is provided for the other one of the control device and the signal transmission device.

7. A connection arrangement according to claim 1, wherein the first and second connectors have means for locking these connectors.

8. A connection arrangement according to claim 1, wherein said signal transmission device amplifies said input signal.

9. A connection arrangement according to claim 1, wherein said electrical connecting elements are signal lines.

10. A connection arrangement according to claim 9, wherein said signal lines constitute a flat cable.

11. An information transmission apparatus comprising:
    transmission means having a first connector portion in which a plurality of terminals as many as the number of information signals to be transmitted are formed;
    control means having a second connector portion in which a plurality of terminals as many as the number of said information signals are formed, and
    wherein said transmission means is connected between a main station and said control device,
    wherein said transmission means has a first converting means for converting an input signal from said main station into a control signal readable by said control means, and
    wherein said transmission means has a second converting means for converting a signal from said control means into a transmission signal which is readable by said main station and; and
    connecting means for attachably and detachably connecting said first and second connector portions,
    wherein said connecting means connects said control means and said transmission means and is used for transmitting a number of information signals.

12. An information transmission apparatus according to claim 11, wherein said transmission means amplifies said input signal.

13. An apparatus according to claim 11, wherein said connecting means has a plurality of cables which are as many as the number of said information signals and a pair of connector portions each of which is connected to an end of each of said cables.

14. An apparatus according to claim 13, wherein said cables constitute a flat cable.

15. An apparatus according to claim 13, wherein said first connector portion has a first retaining portion, said second connector portion has a second retaining portion, and said pair of connector portions of said connecting means have a pair of third retaining portions adapted to come into engagement with said first and second retaining portions, respectively.

16. An information transmission apparatus comprising:
    transmission means having a circuit board on which a plurality of terminals as many as the number of information signals to be transmitted are formed;
    control means having a first connector portion in which a plurality of terminals as many as the number of said information signals are formed,
    wherein said transmission means is connected between a means station and said control means,
    wherein said transmission means has a first converting means for converting an input signal from said means station into a control signal readable by said control means, and
    wherein said transmission means has a second converting means for converting a signal from said control means into a transmission signal readable by said means station and; and
    connecting means connected to the terminals of said circuit board and having a second connector portion which is attachably and detachably connected with said first connector portion,
    wherein said connecting means connects said transmission means and said control means and is used for transmitting a number of information signals.

17. An information transmission apparatus according to claim 16, wherein said transmission means amplifies said input signal.

18. An apparatus according to claim 16, wherein said first and second connector portions have retaining portions adapted to come into engagement with each other.

19. An apparatus according to claim 16, wherein said connecting means has a plurality of cables which are as many as the number of said information signals and said second connector portion is attached and connected to one end of each of said cables.

20. An apparatus according to claim 19, wherein said cables constitute a flat cable.

21. An information transmission apparatus comprising:
 transmission means having a first connector portion in which a plurality of terminals as many as the number of information signals to be transmitted are formed;
 control means having a circuit board on which a plurality of terminals as many as the number of said information signals are formed,
 wherein said transmission means is connected between a main station and said control means,
 wherein said transmission means has a first converting means for converting an input signal from said main station into a control signal readable by said control means, and
 wherein said transmission means has a second converting means for converting a signal from said control means into a transmission signal readable by said main station; and
 connecting means connected to the terminals of said circuit board and having a second connector portion which is attachably and detachably connected with said first connector portion,
 wherein said connecting means connects said transmission means and said control means and is used for transmitting a number of information signals.

22. An information transmission apparatus according to claim 21, wherein said transmission means amplifies said input signal.

23. An apparatus according to claim 21, wherein said first and second connector portions have retaining portions adapted to come into engagement with each other.

24. An apparatus according to claim 21, wherein said connecting means has a plurality of cables which are as many as the number of said information signals and the second connector portion is attached and connected to one end of each of said cables.

25. An apparatus according to claim 24, wherein said cables constitute a flat cable.

26. An information transmission apparatus comprising:
 transmission means having a first connector portion in which a plurality of terminals as many as the number of information signals to be transmitted are formed; and
 control means having a second connector portion in which a plurality of terminals as many as the number of said information signals are formed and which is attachably and detachably connected with said first connector portion,
 wherein said transmission means is connected between a main station and said control means,
 wherein said transmission means has a first converting means for converting an input signal from said main station into a control signal readable by said control means,
 wherein said transmission means has a second converting means for converting a signal from said control means into a transmission signal readable by said main station, and
 wherein said first and second connector portions connect said control means and said transmission means and are for transmitting a number of information signals.

27. An apparatus according to claim 26, wherein the first and second connector portions are provided for the side surfaces for said transmission means and said control means, respectively.

28. An information transmission apparatus according to claim 26, wherein said transmission means amplifies said input signal.

* * * * *